(12) United States Patent
Li

(10) Patent No.: US 6,439,895 B1
(45) Date of Patent: Aug. 27, 2002

(54) PIN-FREE SOCKET COMPATIBLE WITH OPTICAL/ELECTRICAL INTERCONNECTS

(75) Inventor: Yuan-Liang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/948,620

(22) Filed: Sep. 10, 2001

(51) Int. Cl.[7] .............................................. H01R 12/00
(52) U.S. Cl. ........................................... 439/71; 439/66
(58) Field of Search ............................. 439/70, 71, 66, 439/108

(56) References Cited

U.S. PATENT DOCUMENTS 5,263,108 A * 11/1993 Kurokawa et al. ............ 385/89
5,309,324 A * 5/1994 Herandez et al. ........... 361/734
5,521,992 A * 5/1996 Chun et al. .................... 385/14
5,763,947 A * 6/1998 Bartley ........................ 257/701

* cited by examiner

*Primary Examiner*—Tulsidas Patel
(74) *Attorney, Agent, or Firm*—Antonelli, Terry, Stout & Kraus, LLP

(57) ABSTRACT

A socket that includes: a housing, one or more power conductors, and one or more ground conductors. The power conductors and ground conductors are conductive bars imbedded in one or more walls of the housing in a checkerboard pattern providing a low inductance and low resistance current path. The housing may contain an opening in the center and has a top side and a bottom side. The power conductors and the ground conductors are electrically connectable to an electronic package on the top side of the housing and a printed circuit board on the bottom side of the housing. The socket is pin-free and compatible with electronic packages that transfer information over optical interconnects on a printed circuit board.

14 Claims, 4 Drawing Sheets

PIN-FREE SOCKET COMPATIBLE WITH OPTICAL/ELECTRICAL INTERCONNECTS

BACKGROUND

1. Field of the Invention

This invention relates to sockets for electronic packages, and more specifically to sockets capable of handling high power and compatible with optical interconnects on a printed circuit board.

2. Background Information

Most electronic units include a printed circuit board with electronic packages attached to the printed circuit boards. These electronic packages contain one or more chips (e.g., processors) or other circuitry. The packages are plugged into or otherwise electrically attached to sockets. These sockets are electrically attached to the printed circuit board and connect the chip or electronic circuits in the package to wiring traces on or embedded in the printed circuit board.

As the frequencies of processors increase, the currents required increases proportionally. In addition, while the magnitude of the current increases, the amount of area to carry the current through the socket is decreased. For example, as a processor die size is shrunk to get a higher frequency, the package that holds the die gets smaller. High currents through sockets require low resistances to have small power dissipation as described by the equation Power=Current squared×Resistance. Larger power dissipations in the socket result in higher temperatures in the socket. Higher temperatures in a socket cause problems regarding quality and reliability.

FIG. 1 shows a diagram of a current socket design. The socket 10 shown in FIG. 1 contains a matrix of pins that include both signal pins, power pins, and ground pins. The power and ground pins are distributed throughout the socket 10 among the signal pins. Further, the signal, power and ground pins are all the same size. Therefore, in order for a chip that has high current demands to handle this increase in current, the number of pins assigned to power and ground needs to increase. However, increasing the number of power and ground pins subtracts from the number of available pins for signals. Larger power dissipations in the socket result in higher temperatures in the socket. Increasing the number of pins is costly, not only in terms of actual dollar cost for the extra pins but, as noted previously, also for the real estate on the socket needed for the extra pins.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein.

DETAILED DESCRIPTION

The particulars shown herein are by way of example and for purposes of illustrative discussion of the embodiments of the present invention. The description taken with the drawings make it apparent to those skilled in the art how the present invention may be embodied in practice.

Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Although example embodiments of the present invention may be described using an example system block diagram in an example host unit environment, practice of the invention is not limited thereto, i.e., the invention may be able to be practiced with other types of systems, and in other types of environments.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The present invention relates to a pin-free socket that is compatible with using optical interconnects for signal transmission across a printed circuit board from one device to another device. Further, the socket of the present invention provides direct current (DC) conductors along the perimeter of the socket that provide a path for the majority of the total current of a device attached to the socket. This moves the high DC current away from the signals transferred through the interior of the socket. Therefore, the power dissipation through the pins is decreased which removes socket reliability concerns that involve heat.

Figure 1:
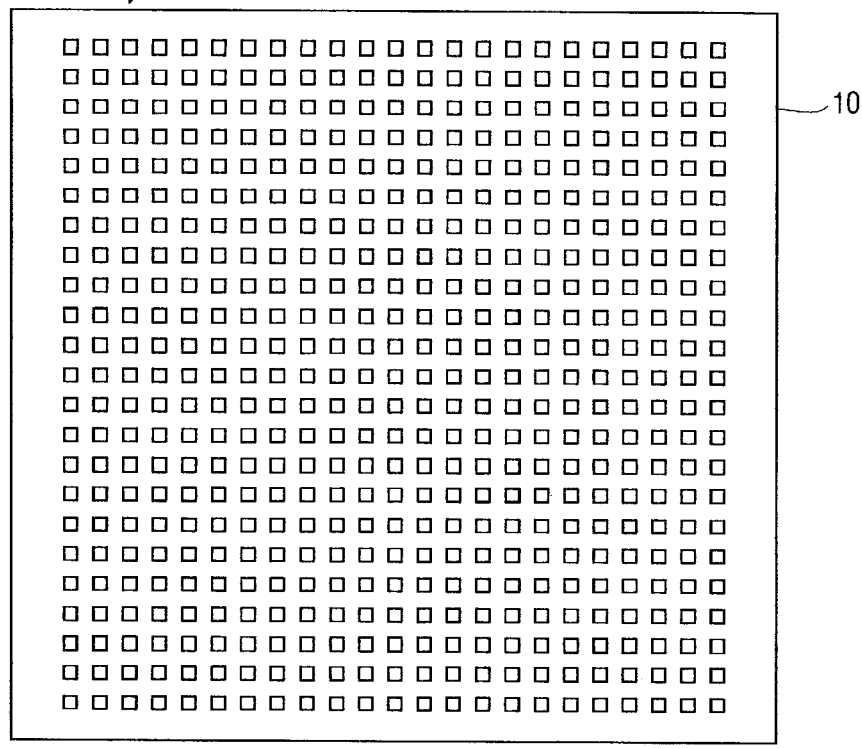
FIG. 1 is a diagram of a current socket design.
Figure 2:
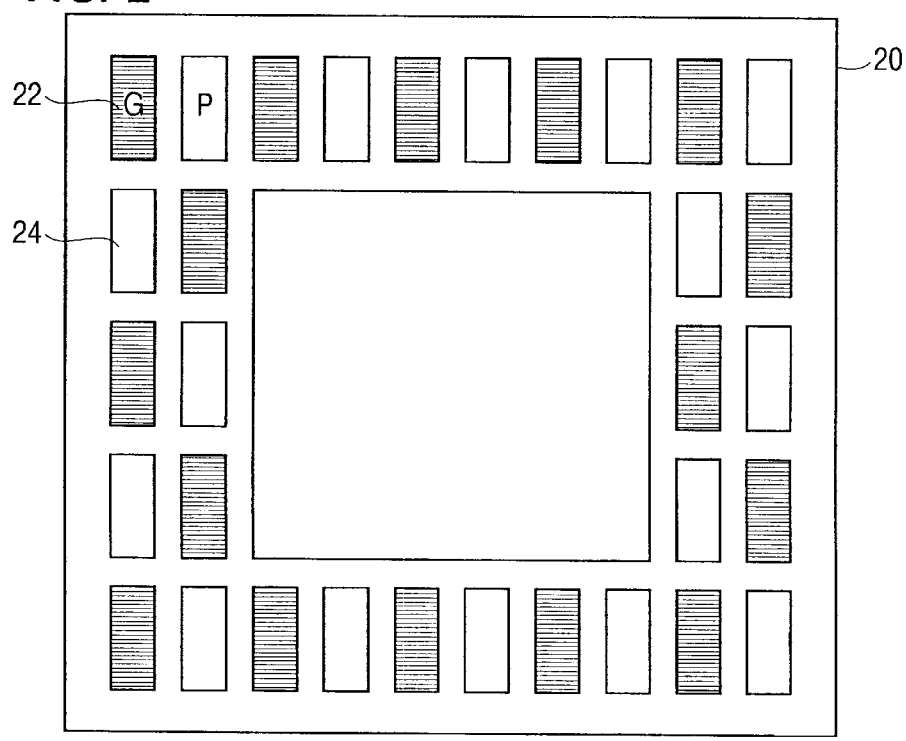
FIG. 2 is a top view diagram of a pin-free socket according to an example embodiment of the present invention.

FIG. 2 shows a top view diagram of a pin-free socket according to an example embodiment of the present invention. As shown in FIG. 2, socket 20 has an opening in the center that allows for optical signals to be transmitted between a chip/device attached to the socket and optical fibers on a printed circuit board. Further, ground conductors 22 and power conductors 24 may be in the form of conductive bars distributed in a checkerboard pattern along the walls of socket 20. The example embodiment shown in FIG. 2 shows a checkerboard pattern of power and ground bars 22, 24 along all sides (walls) of pin-free socket 20. However, the power and ground bars 22, 24 may reside in anywhere from one wall of the socket, to all walls of the socket and still be within the spirit and scope of the present invention.

The checkerboard pattern of power and ground conductive bars according to the present invention is advantageous in that this achieves a lower inductance as well as a low resistance. The power and ground bars 22, 24 may be conductive bars such as copper or any other conductive material. The power and ground conductive bars 22, 24 may be connected to a package on the top side of socket 20, and connected to a printed circuit board on the bottom side of socket 20. The power and ground conductive bars 22, 24 may be attached to the printed circuit board by being inserted in holes in the printed circuit board, or by being soldered to pads on the printed circuit board. A package containing a chip/device may be electrically connected to socket 20 by insertion of pins of the chip/device into the holes of socket 20 (in which case, the conductive bars are part of the chip/device), or attached by solder balls to the conductive bars 22, 24 of socket 20. The conductive bars may be of any shape, e.g., square, circular, rectangular, etc. and still be within the spirit and scope of the present invention.

Figure 3:
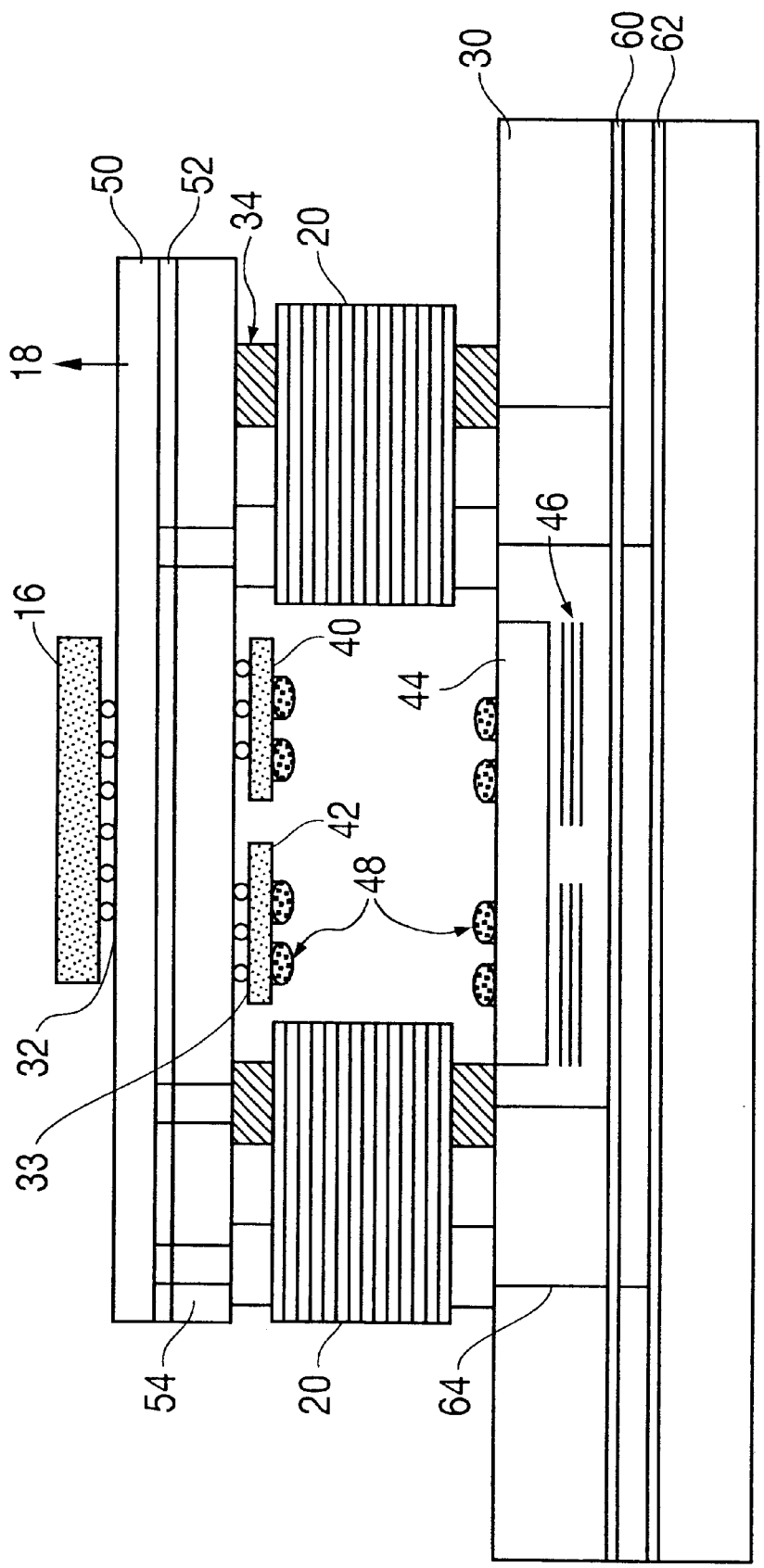
FIG. 3 is a side view diagram of a pin-free socket in an opto-electrical interconnect system according to an example embodiment of the present invention.

FIG. 3 shows a side view diagram of a pin-free socket in an opto-electrical interconnect system according to an example embodiment of the present invention. A chip/device 16 may be housed in a package 18. Chip/device 16 may be connected to package 18 via C4 (controlled collapse chip connector) bumps 32. Package 18 may be connected to socket 20 via power and ground solder pads 34. Ground and power conductive bars 22, 24 shown in FIG. 2 may be connected to solder pads 34. In FIG. 3, the center front portion of socket 20 is not shown in order to illustrate the optical transmitter and optical receiver, 40, 42 that may be attached to the underside of package 18 via C4 bumps 33. Further, a transparent substrate 44 that may be embedded in printed circuit board 30 and cover the optical fibers 46 is also shown. Optical transmitter 40 and optical receiver 42 as well as transparent substrate 44 contain microlens arrays 48 that focus the optical signals transmitted between chip 16 and optical fibers 46.

Package 18 may have an embedded power plane 50 and ground plane 52 that receive power from printed circuit board 30 through socket 20 by means of vias 54 in package 18. Similarly, printed circuit board 30 may have a power plane 60 and ground plane 62 embedded in it. Power plane 60 and ground plane 62 may supply power and ground through socket 20 to package 18 through vias 64 inside printed circuit board 30.

Figure 4:
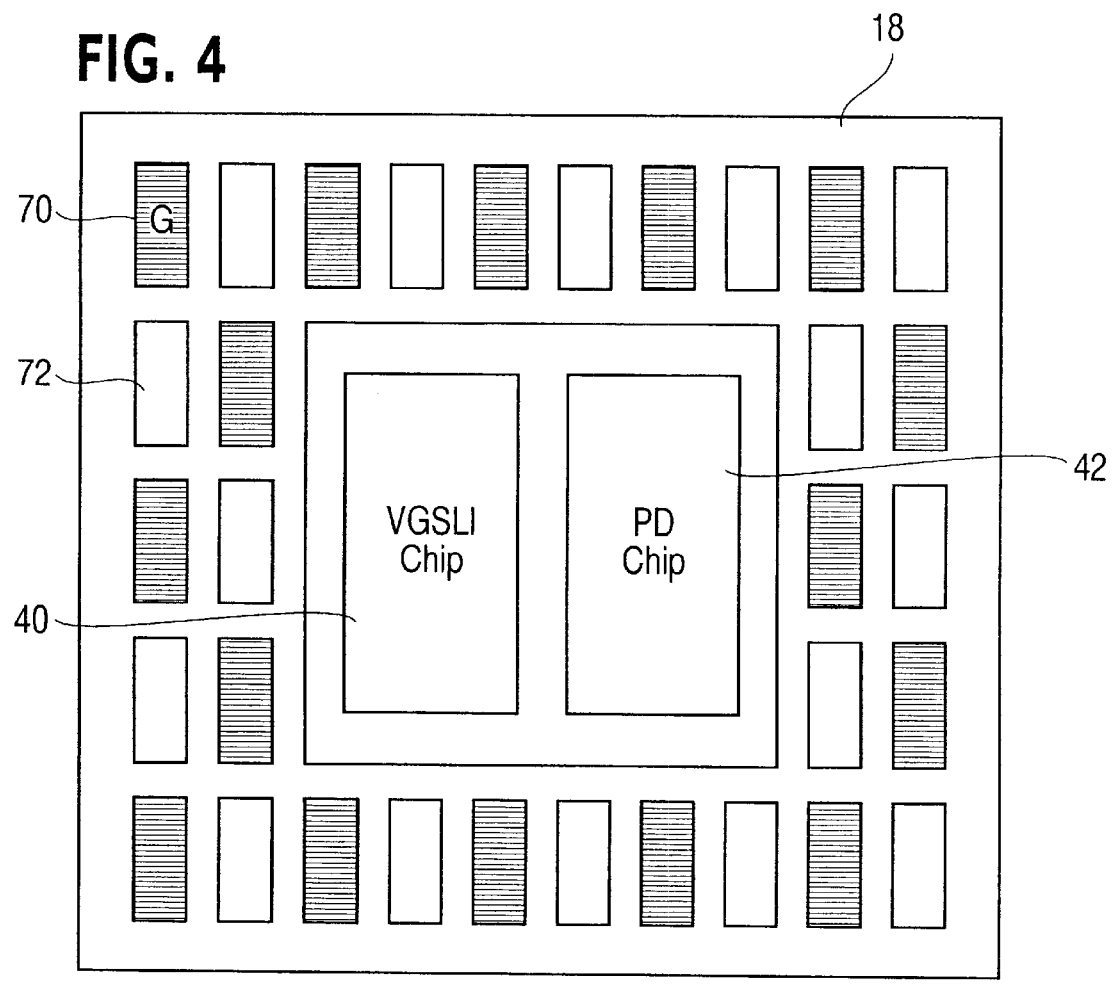
FIG. 4 is a bottom view diagram of an opto-electrical package with solder pads according to an example embodiment of the present invention.

FIG. 4 shows a bottom view diagram of an opto-electrical package with solder pads according to an example embodiment of the present invention. Package 18 may include power pads 72 and ground pads 70 in walls on the perimeter of the package in a checkerboard pattern. An optical transmitter 40 and optical receiver 42 are also shown in the center of package 18. The power pads 72 and ground pads 70 may be electrically attached to power and ground bars 22, 24 in socket 20.

Figure 5B:
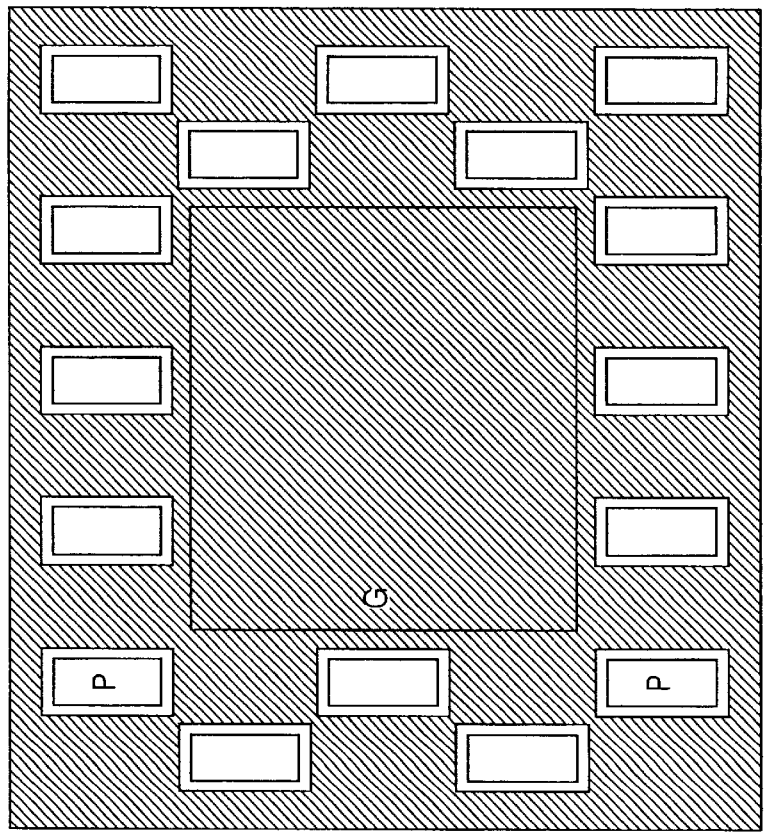
FIGS. 5a and 5b are bottom view diagrams of a power plane and ground plane, respectively, of an opto-electrical package according to an example embodiment of the present invention.
Figure 5A:
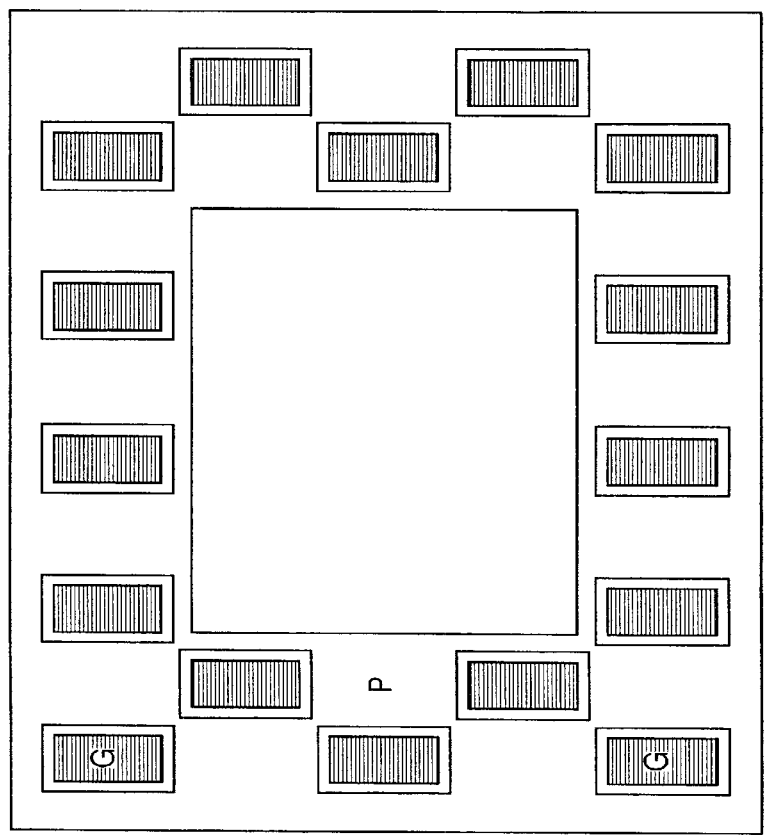

FIGS. 5*a* and 5*b* show bottom view diagrams of a power plane and ground plane, respectively, of an opto-electrical package according to an example embodiment of the present invention. FIG. 5*a* shows the diagram of a power plane where the rectangles denote holes in the power plane where the conductive ground bars pass through. An insulating material may exist that prevents contact of the conductive ground bars with the power plane. Similarly, FIG. 5*b* shows a ground plane where the rectangles denote holes in the ground plane where the power conductive bars pass through. An insulating material may exist that prevents contact of the conductive power bars with the ground plane. Note that if the power plane in FIG. 5*a* is placed over the top of the ground plane in FIG. 5*b*, the power and ground conductive bars produce an alternating checkerboard pattern on the bottom of package 18 (as shown in FIG. 4).

It is noted that the foregoing examples have been provided merely for the purpose of explanation and are in no way to be construed as limiting of the present invention. While the present invention has been described with reference to a preferred embodiment, it is understood that the words that have been used herein are words of description and illustration, rather than words of limitation. Changes may be made within the purview of the appended claims, as presently stated and as amended, without departing from the scope and spirit of the present invention in its aspects. Although the present invention has been described herein[]with reference to particular methods, materials, and embodiments, the present invention is not intended to be limited to the particulars disclosed herein, rather, the present invention extends to all functionally equivalent structures, methods and uses, such as are within the scope of the appended claims.

What is claimed is:

1. A signal pin-free socket comprising:
    at least two power conductors, each at least two power conductors comprising a conductive bar;
    at least two ground conductors, each at least two ground conductors comprising a conductive bar; and
    a housing, the housing containing an opening in the center and having a top side and a bottom side, the at least two power conductors and the at least two ground conductors being imbedded in at least one wall of the housing in a checkerboard pattern providing a low inductance and low resistance current path and electrically connectable to an electronic package on the top side of the housing and a printed circuit board on the bottom side of the housing,
    wherein the signal pin-free socket is compatible with electronic packages that transfer information over optical interconnects on a printed circuit board.

2. The socket according to claim 1, wherein the at least two power conductors comprises one of a cylindrical conductive bar, a rectangular conductive bar, and a square conductive bar.

3. The socket according to claim 1, wherein the at least two ground conductors comprises one of a cylindrical conductive bar, a rectangular conductive bar, and a square conductive bar.

4. The socket according to claim 1, wherein the at least two power conductors and the at least two ground conductors comprise copper metal bars.

5. A signal pin-free socket comprising:
    at least two power conductors, each at least two power conductors comprising a conductive bar;
    at least two ground conductors, each at least two ground conductors comprising a conductive bar; and
    a housing, the housing having a top side and a bottom side, the at least two power conductors and the at least two ground conductors being imbedded in at least one wall of the housing in a checkerboard pattern providing a low inductance and low resistance current path and electrically connectable to an electronic package on the top side of the housing and a printed circuit board on the bottom side of the housing.

6. The socket according to claim 5, wherein the at least two power conductors comprises one of a cylindrical conductive bar, a rectangular conductive bar, and a square conductive bar.

7. The socket according to claim 5, wherein the at least, two ground conductors comprises one of a cylindrical conductive bar, a rectangular conductive bar, and a square conductive bar.

8. The socket according to claim 5, wherein the at least two power conductors and the at least two ground conductors comprise copper metal bars.

9. A printed circuit board assembly comprising:

at least one electronic package, each at least one electronic package containing at least one chip;

at least one socket, each at least one electronic package connected to one at least one socket;

a printed circuit board, each at least one socket being attached to the printed circuit board, wherein the at least one socket is signal pin-free and compatible with electronic packages that transfer information over optical interconnects on the printed circuit board.

10. The assembly according to claim 9, wherein the at least one socket contains an opening in the center allowing optical signals to be transferred between the at least one package and the printed circuit board.

11. The assembly according to claim 9, the at least one socket containing at least two power conductors and at least two ground conductors, the at least two power conductors and the at least two ground conductors being imbedded in at least one wall of the at least one socket in a checkerboard pattern providing a low inductance and low resistance current path, the at least two power conductors and the at least two ground conductors being electrically connected to the at least one electronic package on a top side of the socket and the printed circuit board on a bottom side of the socket.

12. The assembly according to claim 11, wherein the at least two power conductors and the at least two ground conductors comprise metal bars.

13. The assembly according to claim 11, wherein the metal bars comprise one of cylindrical metal bars, rectangular metal bars, and square metal bars.

14. The assembly according to claim 11, wherein the at least two power conductors and the at least two ground conductors comprise copper metal bars.

* * * * *